United States Patent [19]
Yip et al.

[11] Patent Number: 5,465,217
[45] Date of Patent: Nov. 7, 1995

[54] METHOD FOR AUTOMATIC TAB ARTWORK BUILDING

[75] Inventors: Wai-Yeung Yip; Arijit Chandra, both of Mesa; Chi-Taou Tsai, Chandler, all of Ariz.

[73] Assignee: Motorola, Inc., Schaumburg, Ill.

[21] Appl. No.: 106,852

[22] Filed: Aug. 16, 1993

[51] Int. Cl.⁶ .............................. H01L 23/48; G06F 17/50
[52] U.S. Cl. .......................... 364/489; 364/488; 364/490; 364/491
[58] Field of Search ..................................... 364/488–491, 364/578; 307/465.1, 482.1; 437/50, 180, 206, 209, 220; 29/825, 25.01, 592.1

[56] References Cited

U.S. PATENT DOCUMENTS

| | | | |
|---|---|---|---|
| 3,698,072 | 10/1972 | Koens et al. | 29/574 |
| 4,523,106 | 6/1985 | Tanizawa et al. | 307/303 |
| 4,711,700 | 12/1987 | Cusack | 156/651 |
| 4,864,514 | 9/1989 | Yamanaka et al. | 364/489 |
| 4,955,131 | 9/1990 | Chall, Jr. | 29/830 |
| 5,081,561 | 1/1992 | Smith | 361/400 |
| 5,091,825 | 2/1992 | Hill et al. | 361/404 |
| 5,258,920 | 11/1993 | Haller et al. | 364/490 |
| 5,275,897 | 1/1994 | Nagesh et al. | 430/22 |
| 5,292,687 | 3/1994 | Isozaki | 437/209 |
| 5,300,815 | 4/1994 | Rostoker | 257/786 |

*Primary Examiner*—Kevin J. Teska
*Assistant Examiner*—Leigh Marie Garbowski
*Attorney, Agent, or Firm*—Bernard Berman

[57] ABSTRACT

A method for automated artwork building which comprises determining a desired die pad pitch, assigning inner lead bonding positions for each lead based on the average die pitch. The desired outer lead bonding position is then determined for each lead. The allowable range of fan in and fan out angles for each lead is computed according to design and manufacturing constraints. An electrical cost function is formulated based on signal lead crosstalk and ground lead simultaneous switching noise. Each lead is then routed. The routing is repeated for each lead for each allowable combination of fan in and fan out angles. Finally the optimal routing is selected based on electrical characteristics.

5 Claims, 4 Drawing Sheets

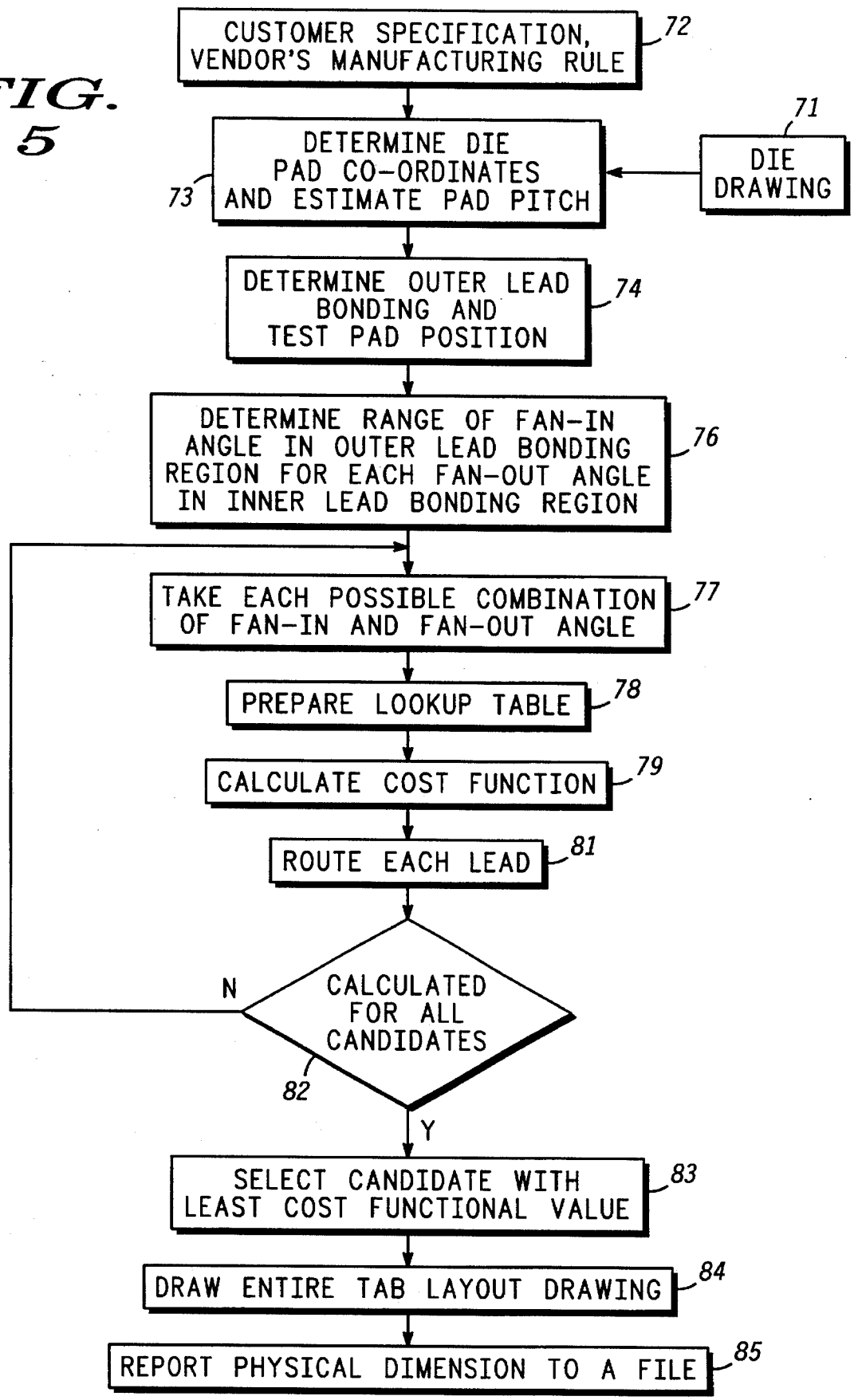

METHOD FOR AUTOMATIC TAB ARTWORK BUILDING

BACKGROUND OF THE INVENTION

The present invention relates, in general, to packaging of electronic parts, and more particularly to a method for automatically generating optimized artwork for custom packages.

Electronic packaging technology plays a critical role in meeting the customer demand for increasingly compact and higher performance of electronic equipment. Tape automated bonding (TAB) is one major technology which helps the electronic packaging industry to meet this challenge. TAB packages allow a fine inner lead bonding or ILB pitch between integrated circuit die pads, yield a superior mechanical strength for bonding, and allows direct outer lead bonding (OLB) to a printed circuit board also at a fine pitch. Fine pitch direct outer lead bonding uses a finer pitch than prior methods. Thus TAB packages help reduce the package body size and produces a more compact printed circuit board as well as better electrical performance.

Typically a TAB package is custom designed manually for each new chip. In an ASIC environment this requires that each new design have a manually designed TAB package for that particular customer order. Even with a skilled designer the design is not electrically optimized. Each of these TAB package routings must be electrically modeled and simulated to check performance at high speed. This is a time consuming process. Standards exist for outer lead bonding but layout of the remainder of the TAB package requires highly skilled judgement. Manual measurement of physical dimensions is required for electrical characterization which makes the process even slower, less accurate, and more error prone. As a result not all leads are characterized for simulation. If the TAB package needs to be redesigned for manufacturability or performance requirements, this can be costly in both money spent and time wasted. Even though a simulation is performed there is no guarantee that the design is electrically the best possible one for this particular chip.

There is a need for a method to produce an error free TAB package design having optimal electrical performance in all cases. This method should eliminate the need for redesign of these packages saving expensive tooling and piece part costs. Complete dimensional information must be extracted to facilitate electrical characterization. Electrical performance must be characterized for every lead of the design. In addition the method should reduce design cycle time and hence reduce the time required to bring a product to market.

SUMMARY OF THE INVENTION

A method for automated artwork building which comprises determining a desired die pad pitch, assigning inner lead bonding positions for each lead based on the average die pitch. The desired outer lead bonding position for each lead is then determined. The allowable range of fan in and fan out angles for each lead is computed according to design and manufacturing constraints. An electrical cost function based on signal lead crosstalk, as well as supply lead simultaneous switching noise is calculated for each allowable pair of fan in and fan out angles. Each lead is then routed. The routing is repeated for each lead for each allowable combination of fan in and fan out angles. Finally the optimal routing is selected based on electrical characteristics as denoted by the calculated value of the electrical cost function.

BRIEF DESCRIPTION OF THE DRAWINGS

FIG. 5 shows a functional flow chart which illustrates the steps of a preferred embodiment in accordance with the present invention.

DETAILED DESCRIPTION OF THE DRAWINGS

Figure 1:
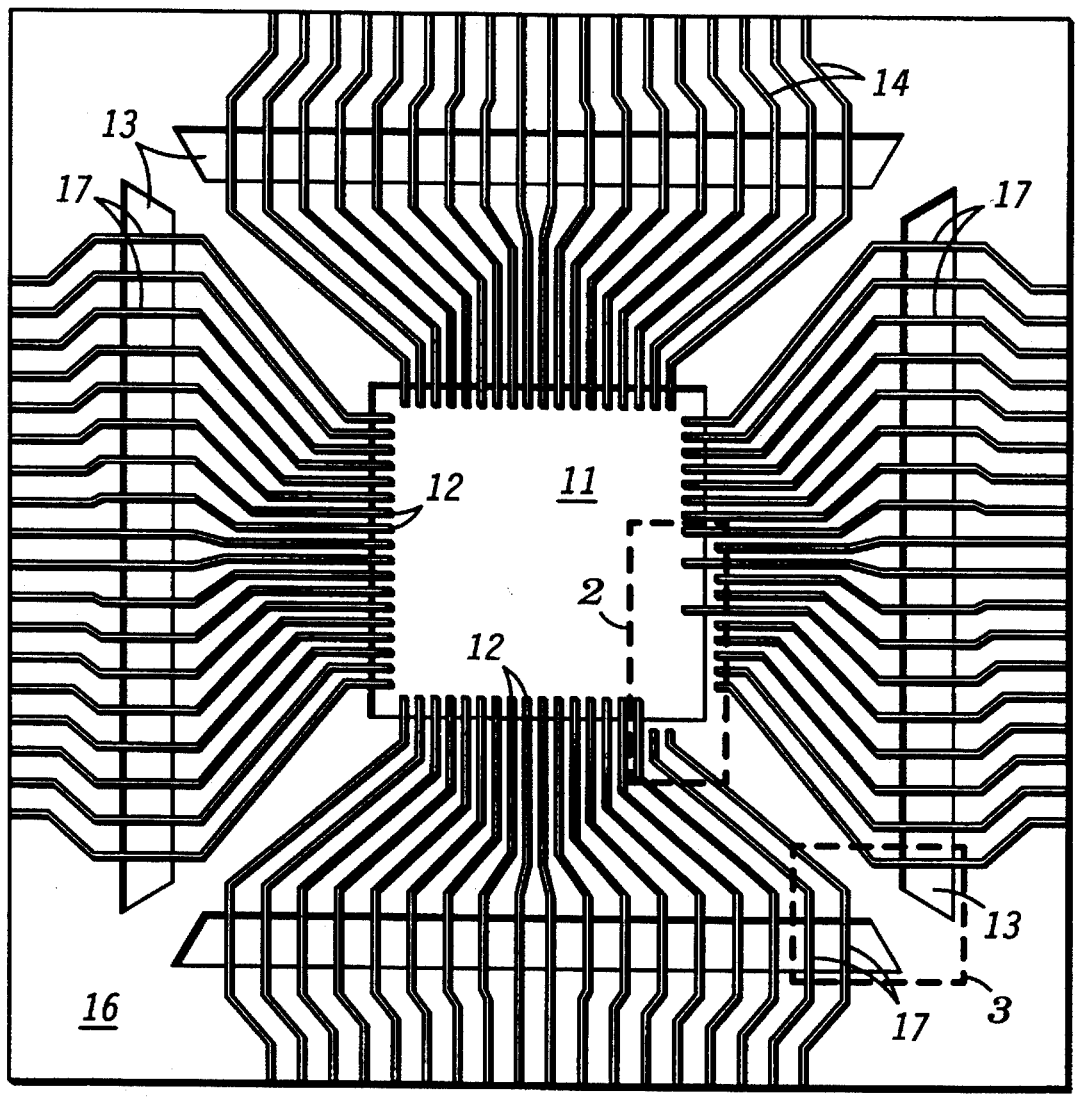
FIG. 1 shows a top view of a typical TAB package produced by a method in accordance with a preferred embodiment of the present invention.

FIG. 1 shows a top view of a typical TAB package 10 produced by a method in accordance with a preferred embodiment of the present invention. A plurality of metal traces 12 is held in position by a polyimide substrate 16. A hole 11 in polyimide substrate 16 is positioned such that an integrated circuit die may be mounted to contact with plurality of metal traces 12. Metal traces 12 extend into hole 11 for a sufficient distance to contact solder bumps built on the integrated circuit die. Metal traces 12 extend outward from hole 11 and increase in pitch crossing a slot 13. Across slot 13 is a region 17 of metallic traces 12 which are used to contact a printed circuit board using surface mount technology. In this example, slot 13 defines the outer lead bonding area or OLB, while hole 11 defines the inner lead bonding area or ILB.

Figure 2:
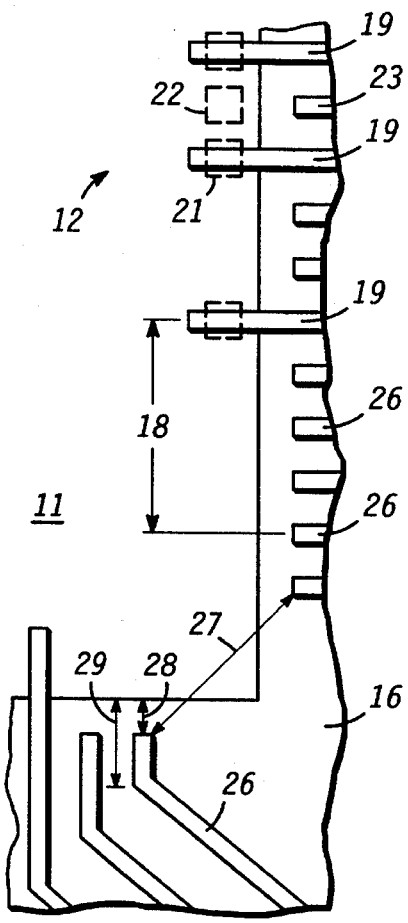
FIG. 2 shows an enlarged view of one corner of the inner lead bonding area of the typical TAB package shown in FIG. 1.

FIG. 2 shows an enlarged view of one corner (2) of the inner lead bonding area of TAB package 10 shown in FIG. 1. A plurality of solder bumps 21 are shown positioned to connect to a plurality of connecting traces 19. For simplicity and clarity the only portion of the semiconductor die shown are solder bumps 21 and unused solder bump 22. An unused metallic trace 23 does not extend beyond the edge of polyimide substrate 16 into hole 11. Likewise unused corner metal traces 26 are spaced a distance 28 from hole 11. At this corner of TAB package 10 the minimum distance between the two corner traces is clearance 27. Leads 19, 23, and 26 comprise parts of metal traces 12. All metal traces 12 must extend a distance 29 from hole 11 before a bend is allowed.

Figure 3:
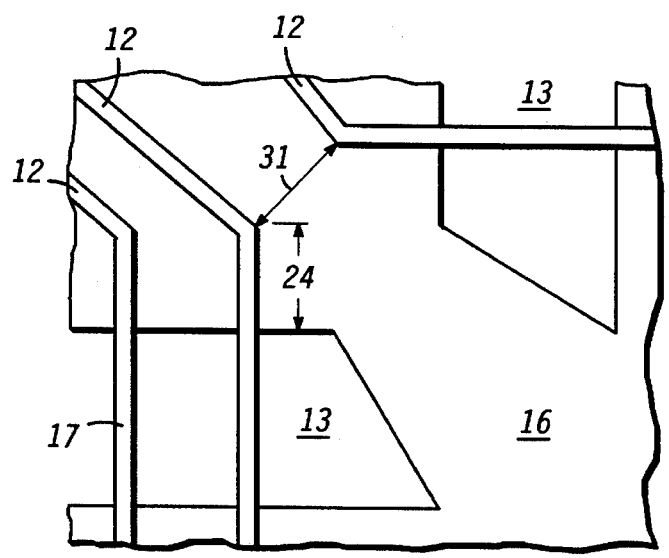
FIG. 3 shows an enlarged portion of the outer lead bonding area from the typical TAB package shown in FIG. 1.

FIG. 3 shows an enlarged portion (3) of the outer lead bonding area from TAB package 10 shown in FIG. 1. A spacing 31 represents the minimum between corner leads on adjacent sides of any corner. An OLB clearance 24 is the minimum distance from a bend to slot 13.

Figure 4:
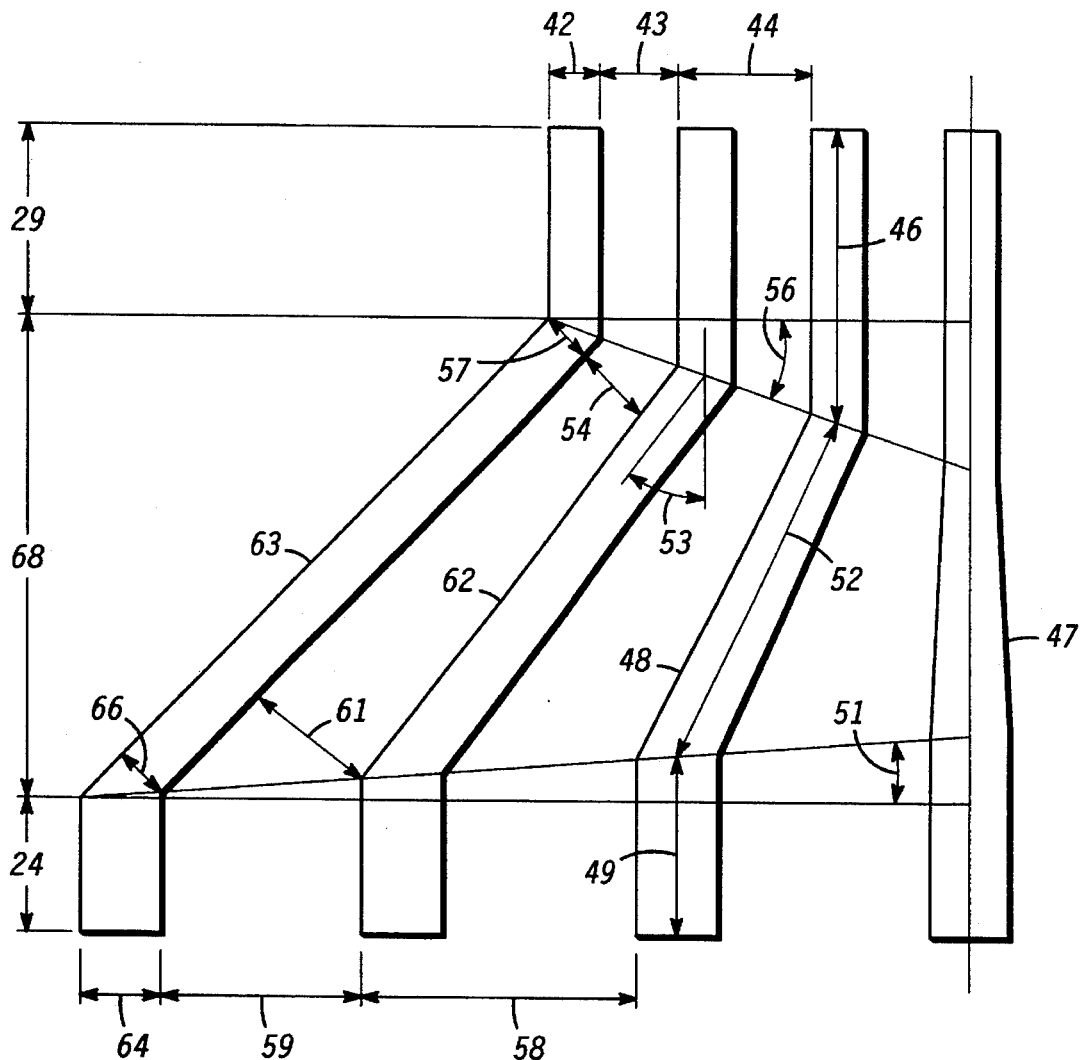
FIG. 4 is a schematic drawing which shows various TAB lead parameters which are used by a preferred embodiment in accordance with the present invention.

FIG. 4 is a schematic drawing which shows various TAB metal trace parameters which are used by a preferred embodiment in accordance with the present invention. For clarity and brevity, FIG. 4 shows only a small portion of TAB package 10 with all metal traces 12 in a vertical orientation, however it should be understood that the description applies equally to all four sides and to the symetrical quadrants. The geometric parameters are defined and computed as follows:

N=total metal traces 12 for TAB package 10. For the portion of TAB package 10 represented in FIG. 4, N=28.

n=metal traces 12 in each half quadrant. For the portion of TAB package 10 represented in FIG. 4, n=4.

k=individual number of a particular metal trace 12. Thus for metal trace 47, k=1; metal trace 48, k=2; metal trace 62, k=3; and metal trace 63, k=4.

$w_i$=ILB width 42.

$s_i$=ILB spacing 43.

$p_i$=ILB pitch 44.

$C_i$=ILB length 29 for connecting traces 19 (FIG. 2).

$w_o$=OLB width 64.

$s_o$=OLB spacing 59.

$p_o$=OLB pitch 58.

$C_o$=OLB length 24.

H=vertical distance 68 between two bends of the outer edge of metal trace 63.

$\theta_i$=fanout angle 56 from ILB region to transition region.

$\theta_o$=fan in angle 51 from transition region to OLB region.

x=offset constant, defined as 0.5 for even n, and 1 for odd n.

Length 46 of metal trace k in the ILB region:

$$l_{i,k} = [p_i(n-k) + w_i/2] \tan \theta_i + C_i.$$

Length 49 of metal trace k in the OLB region:

$$l_{o,k} = [p_o(n-k) + w_o/2] \tan \theta_o + C_o.$$

Length 52 of metal trace k in the transition region:

$$l_{f,k} = \sqrt{\{(H - l_{i,k} - l_{o,k})^2 + [(p_o - p_i)(k-x)]^2\}}.$$

Angle 53 of transition region from vertical of lead k:

$$\alpha_k = \tan^{-1}\left\{ \frac{[(p_o - p_i)(k-x)]}{(H - l_{i,k} - l_{o,k})} \right\}.$$

Transition width 57 of lead k at the ILB end:

$$w_{fi,k} = \frac{w_i \cos(\alpha_k - \theta_i)}{\cos(\theta_i)}.$$

Transition spacing 54 of lead k at the ILB end:

$$s_{fi,k} = \frac{s_i \cos(\alpha_k - \theta_i)}{\cos(\theta_i)}.$$

Transition width 66 of lead k at the OLB end:

$$w_{fo,k} = \frac{w_o \cos(\alpha_k - \theta_o)}{\cos(\theta_o)}.$$

Transition spacing 61 of lead k at the OLB end:

$$s_{fo,k} = \frac{s_o \cos(\alpha_k - \theta_o)}{\cos(\theta_o)}.$$

The electrical parameters are derived from the geometric parameters using simulation models which are well known in the art. In the preferred embodiment the following quantities are determined as functions of width and pitch using look up tables:

$L_{us,k}$=self inductance per unit length of lead k in region s.

$M_{us,k}$=mutual inductance per unit length of lead k and the adjacent lead in region s.

$C_{us,k}$=capacitance to ground per unit length of lead k in region s.

$X_{us,k}$=mutual capacitance per unit length of lead k and the adjacent lead in region s.

These quantities are determined for four regions:

s=i, corresponding to the ILB region.

s=fi, corresponding to the transition region at the ILB end.

s=fo, corresponding to the transition region at the OLB end.

s=o, corresponding to the OLB region.

Using these parameters a cost function is computed for leads x and s. Lead x is to be optimized for crosstalk and lead s is to be optimized for simultaneous switching noise. The cost function is:

$$G_{xs}(L_x, M_x, C_x, \chi_x, L_s) = w_1 \sqrt{L_x C_x} \left( \frac{M_x}{L_x} + \frac{\chi_x}{C_x} \right) + w_2 f L_s. \qquad \text{Equation 1}$$

where:

$$f = \frac{\sqrt{L_1 C_1} \left( \frac{M_1}{L_1} + \frac{\chi_1}{C_1} \right)}{L_1}$$

$$L_x = l_{i,x} L_{ui,x} + \frac{l_{f,x}}{2}(L_{ufi,x} + L_{ufo,x}) + l_{o,x} L_{uo,x}$$

$$C_x = l_{i,x} C_{ui,x} + \frac{l_{f,x}}{2}(C_{ufi,x} + C_{ufo,x}) + l_{o,x} C_{uo,x}$$

$$\chi_x = l_{i,x} \chi_{ui,x} + \frac{l_{f,x}}{2}(\chi_{ufi,x} + \chi_{ufo,x}) + l_{o,x} \chi_{uo,x}$$

$$L_s = l_{i,s} L_{ui,s} + \frac{l_{f,s}}{2}(L_{ufi,s} + L_{ufo,s}) + l_{o,s} L_{uo,s}.$$

A typical set of constraint rules 72 define limits of the geometry of TAB package 10:

$$0 \leq \theta_i \leq \tan^{-1}\left\{ \frac{H}{\left[ p_i(n-x) + \frac{w_i}{2} \right]} \right\} \qquad \text{Equation 2}$$

$$0 \leq \theta_o \leq \tan^{-1}\left\{ \frac{H}{\left[ p_o(n-x) + \frac{w_o}{2} \right]} \right\} \qquad \text{Equation 3}$$

For each $\theta_i$:

$$0 \leq \theta_o \leq \tan^{-1}\left\{ \frac{H - \left[ p_i(n-x) + \frac{w_i}{2} \right] \tan \theta_i}{\left[ p_o(n-x) + \frac{w_o}{2} \right]} \right\} \qquad \text{Equation 4}$$

In addition manufacturing rules require that for each lead k:

$w_i$, $w_{fi,k}$, $w_{fo,k}$, $w_o$>minimum width allowed, and $s_i$, $s_{fi,k}$, $s_{fo,k}$, $s_o$>minimum spacing allowed.

FIG. 5 shows a functional flowchart which illustrates the steps a preferred embodiment in accordance with the present invention. A die drawing 71 specifies the solder bumps to be used, their positions, and their functions. Constraint rules 72 comprise required constraints on the package including a customer specification which sets forth the requirements desired by the customer and manufacturing rules which set forth the limits to which the vendor who manufactures the TAB package is able to work. Die drawing 71 and constraint rules 72 are used to determine 73 die pad coordinates and pad sizes. If there are extra leads, an average die pad pitch is estimated and used to determine which leads are required to be used and which are required to be left unused. Determining step 74 determines the outer lead bonding lead position and test pad positions from the customer specifications. These typically correspond to a standard arrangement desired for a customer printed circuit board. Determining step 76 determines the range of fan in angle in the outer lead bonding region for each fan out angle in the inner lead bonding region. This step also yields a range of fan in angles which are allowed without violating design and manufacturing rules, and are determined using Equations 2, 3 and 4. Each allowable combination, as determined by Equation 4, is identified 77 and look-up table prepared 78 which prepares an electromagnetic database for an optimization procedure that uses the geometry of each metal trace 12 with equation 1 to derive an electrical cost function 79 $G_{xs}(L_x, M_x, C_x, X_x, L_s)$ or that metal trace 12. Each lead on the package with a particular combination of fan in and fan out angles can then be routed 81. Steps 77, 78, 79, and 81 are repeated 82 until all combinations of fan in and fan out angles are calculated and the look-up table completed by adding the value of the electrical cost function calculated for each allowable combination. The look-up table is scanned and a selection 83 is made of the candidate with the lowest electrical cost function value. The entire TAB layout drawing is prepared 84. Physical dimensions are reported to a computer file 85 from which artwork and subsequently the actually package are prepared.

By now it should be clear that the present invention provides an error free TAB package design having an optimal electrical performance in all cases. The method eliminates the need for redesign of these packages due to errors and substandard electrical performance thus saving expensive tooling and piecepart costs. Complete dimensional information is extracted so as to facilitate electrical characterization. Electrical performance is characterized for each lead of the design. Finally the method reduces design cycle time and hence reduces the time required to bring a product to the market.

We claim:

1. A method for building automated package artwork, comprising:

computing an allowable range of fan in and fan out angles for a plurality of leads according to design and manufacturing constraints, wherein design constraints comprise die pad pitch, inner lead bonding position and outer lead bonding position;

assigning to each fan in angle within the allowable range of fan in and fan out angles, a fan out angle within the allowable range of fan in and fan out angles to form a plurality of allowable combinations of fan in and fan out angles;

calculating a value for an electrical cost function based on signal lead crosstalk and supply lead simultaneous switching noise, for each of the plurality of allowable combinations of fan in and fan out angles; and selecting an optimal routing for each lead based on electrical characteristics as denoted by the value of the electrical cost function.

2. The method for building automated package artwork of claim 1 wherein the artwork comprises traces for an integrated circuit package.

3. The method for building automated package artwork of claim 1 wherein the artwork comprises traces for a TAB package.

4. A method for building automated package artwork, comprising:

determining a die pad pitch based on die pad coordinates and die pad sizes;

assigning a desired inner lead bonding position for each of a plurality of leads based on the die pad pitch;

determining a desired outer lead bonding position for each of the plurality of leads;

determining a desired test pad position;

calculating a range of allowable fan in and fan out angles for the plurality of leads;

calculating the value of an electrical cost function based on signal lead crosstalk and supply lead simultaneous switching noise for each lead of the plurality of leads;

repeating the step of calculating the value of the electrical cost function for each lead of the plurality of leads for each fan in and fan out angle from the range of allowable fan in and fan out angles;

selecting an optimal routing for each lead based on calculated electrical cost function values; and preparing artwork based on the optimal routing.

5. The method for building automated package artwork of claim 4 wherein the artwork comprises traces for a TAB package.

\* \* \* \* \*